United States Patent
Nace (10) Patent No.: US 9,246,441 B1
(45) Date of Patent: Jan. 26, 2016

(54) METHODS AND APPARATUS FOR RELATIVELY INVARIANT INPUT-OUTPUT SPECTRAL RELATIONSHIP AMPLIFIERS

(71) Applicant: Nace Engineering, Inc., Mesa, AZ (US)

(72) Inventor: Arthur E. Nace, Mesa, AZ (US)

(73) Assignee: Nace Engineering, Inc., Mesa, AZ (US)

( * ) Notice: Subject to any disclaimer, the term of this patent is extended or adjusted under 35 U.S.C. 154(b) by 0 days.

(21) Appl. No.: 14/737,856

(22) Filed: Jun. 12, 2015

(51) Int. Cl.
| | |
|---|---|
| *H03F 3/60* | (2006.01) |
| *H03F 1/42* | (2006.01) |
| *H03F 3/20* | (2006.01) |
| *H03F 3/181* | (2006.01) |
| *H04R 3/00* | (2006.01) |

(52) U.S. Cl.
CPC .............. *H03F 1/42* (2013.01); *H03F 3/181* (2013.01); *H03F 3/20* (2013.01); *H04R 3/00* (2013.01); *H03F 2200/03* (2013.01); *H03F 2200/555* (2013.01)

(58) Field of Classification Search
USPC ............... 330/53, 124 R, 107, 3; 381/319
IPC ........................................................ H03F 3/60
See application file for complete search history.

(56) References Cited

U.S. PATENT DOCUMENTS

| | | | | |
|---|---|---|---|---|
| 3,092,783 A | * | 6/1963 | Krohn | H03F 3/44 330/117 |
| 4,495,640 A | | 1/1985 | Frey | |
| 5,032,796 A | | 7/1991 | Tiers | |
| 5,477,188 A | * | 12/1995 | Chawla | H03F 1/301 330/269 |
| 5,834,971 A | * | 11/1998 | Giguere | H03F 3/58 315/3.6 |
| 8,822,802 B1 | | 9/2014 | McGillivary | |
| 2010/0033245 A1 | * | 2/2010 | Arrowsmith | H03F 1/30 330/129 |
| 2010/0045385 A1 | * | 2/2010 | Pengelly | H03F 1/0266 330/295 |
| 2014/0184336 A1 | * | 7/2014 | Nobbe | H03F 1/0227 330/296 |
| 2014/0219477 A1 | | 8/2014 | Scott | |

* cited by examiner

*Primary Examiner* — Patricia T Nguyen
(74) *Attorney, Agent, or Firm* — Bennu Consultancy LLC; Mitchell Chase (57) ABSTRACT

An electronic amplifier delivers to a load an output signal related to an input, typically with increased power. As the power output, volume, or gain of the amplifier is changed, so may the spectral characteristics of the signal. In order to maintain the desired spectral or tonal character of the output signal over the dynamic range of output power, biasing of the amplifier must be adjusted. Particular ratios of drive and bias currents and/or voltages for different implementations of amplifier technologies should be relatively constant to produce substantially invariant input-output spectral relationships from low power output through high power output settings. Several techniques are presented which provide these relationship in amplifiers.

15 Claims, 10 Drawing Sheets

METHODS AND APPARATUS FOR RELATIVELY INVARIANT INPUT-OUTPUT SPECTRAL RELATIONSHIP AMPLIFIERS

FIELD OF THE INVENTION

Embodiments of the present invention relate to amplifiers that retain the power amplifier spectral characteristics over a wide range of output power.

BACKGROUND OF THE INVENTION

An electronic amplifier (amplifier, amp) is an apparatus that enables an input electrical signal to control power from a source independent of the signal and thus is capable of delivering an output that bears some relationship to, and is generally greater than, the input signal. An amplifier may be designed for a specific purpose. For example, radio frequency (RF) amplifiers may convert low-power signals with frequencies generally in the portion of the electromagnetic spectrum between audio and infrared into a larger signal with more power, typically for driving the antenna of a transmitter. In another example, an audio amplifier may amplify audio signals (e.g., signals in the range of human hearing) to a suitable level (magnitude) for driving loudspeakers or other devices. A guitar amplifier is another example of an amplifier designed for a specific purpose. A guitar amplifier is designed to amplify the electrical signal of guitar or an acoustic pickup.

An amplifier may strive to reproduce the electromagnetic spectrum (e.g., spectral characteristics, frequencies, tone) of the input signal. Alternatively, the amplifier may alter the spectrum of the input signal. The output spectrum may depend on the output power level (magnitude). For example, a guitar amplifier may add effects such as distortion at high output power levels. A musician may find these effects desirable. However, guitar amplifiers may fail to reproduce the same effects at lower output power. For example, a musician using a guitar amplifier in a concert hall or arena setting with a high power output may desire to have the same effects at a lower output power while playing in a smaller room or location. Maintaining the relationship of input to output spectrum over the dynamic range (the ratio between the largest and smallest possible values) of output power may not be achievable with typical amplifiers.

In other examples, it may be desirable for audio amplifiers to faithfully reproduce the electromagnetic spectrum of the input signal at the output regardless of output power levels. Audio amplifiers that introduce distortion or other effects alter the original spectrum (e.g., sounds) which listeners may find objectionable. In this example, it is desirable to maintain the relationship of input spectrum to output spectrum over the dynamic range of output power without distortion.

Electronic amplifiers that maintain a desired relationship of input spectrum to output spectrum over the dynamic range of output powers alleviate the problem of power output dependent spectral variations. Thus, maintaining a spectral relationship between an input and output signal in an amplifier is a need felt by many users across multiple fields.

BRIEF DESCRIPTION OF THE DRAWING

Embodiments of the present invention will be described with reference to the drawings, wherein like designations denote like elements, and.

DETAILED DESCRIPTION OF THE PREFERRED EMBODIMENTS

A signal is used to convey information. An electrical signal may be characterized by voltage (e.g., electromotive force), current (e.g., flow of electric charge), electromagnetic waves (e.g., spectrum, frequencies, wavelengths, tones), power (e.g., rate of transferring or transforming energy), and/or other quantities. As used herein, the term "signal" means an electrical signal that conveys information.

An amplifier boosts (e.g., enlarges, magnifies, increases, raises, gains) one or more characteristics (e.g., voltage, current, power) of one or more signals. Amplifiers may have unity gain (e.g., no amplification). Amplifiers may also attenuate a signal. Amplifiers may be designed for particular applications (e.g., guitar amplifier), frequencies ranges (e.g., audio amplifier, radio frequency amplifier), and/or to boost particular characteristics (e.g., current amplifier, voltage amplifier, differential amplifier, inverting amplifier, integrating amplifier). As used herein, the term "amplifier" or "amp" means any electrical or electronic equipment that amplifies one or more characteristics of a signal.

Figure 1:
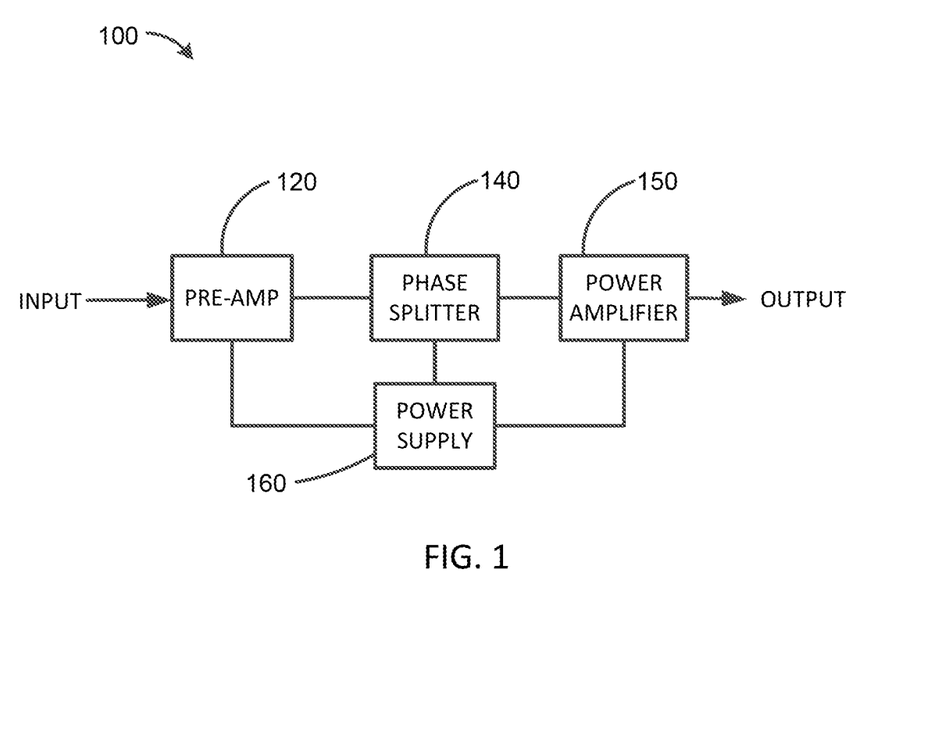
FIG. 1 is a functional block diagram of an apparatus to amplify electrical signals in accordance with various aspects of the present invention.
Figure 2:
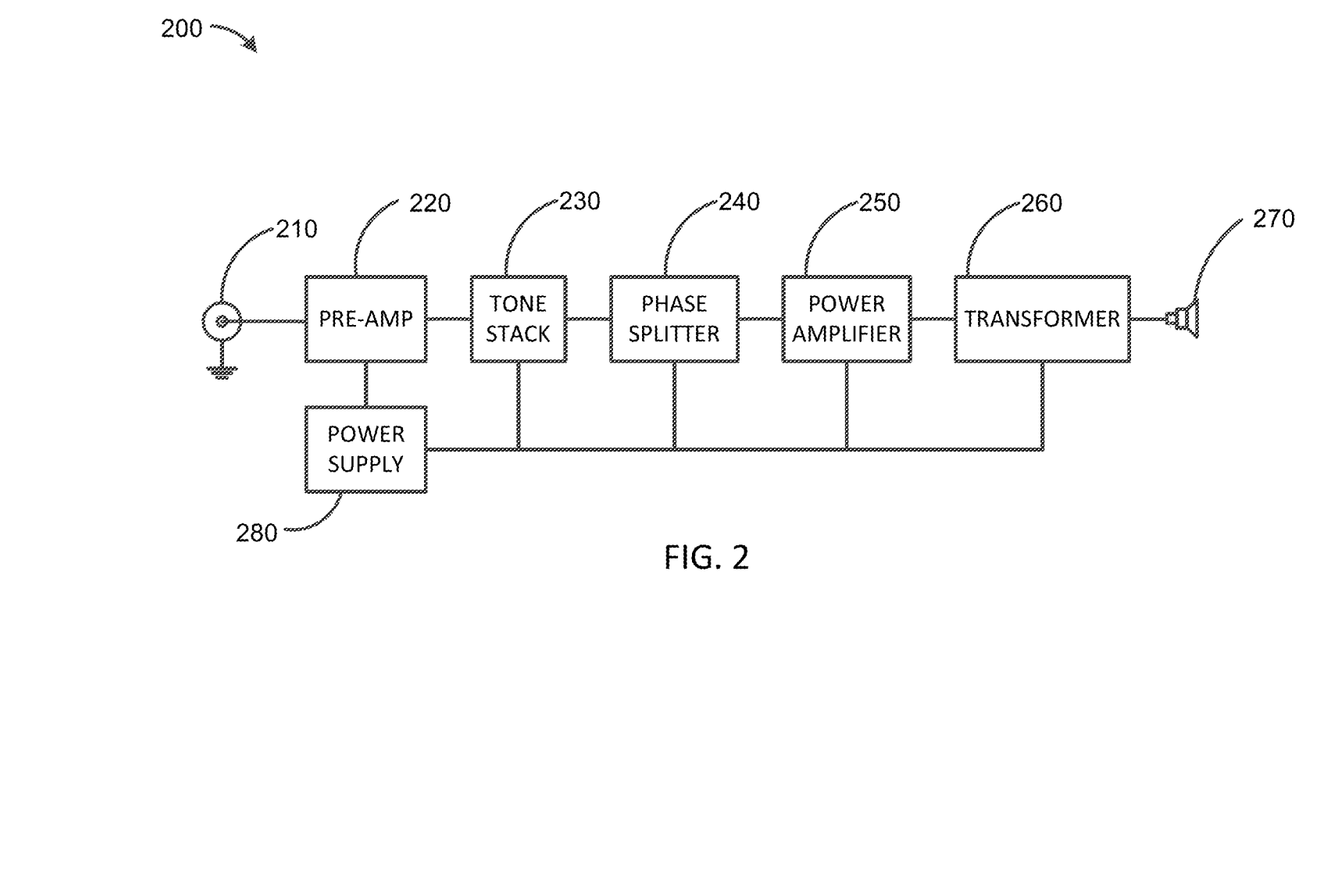
FIG. 2 is a functional block diagram of the amplifier of FIG. 1 for audio signals in accordance with various aspects of the present invention.

An amplifier may include a preamplifier (pre-amp or preamp), a phase splitter, a power amplifier, and a power supply (FIG. 1). An amplifier may also include a tone stack and a transformer (FIG. 2). A pre-amp may electrically couple (e.g., establish an electrical connection, establish a path for current to flow) to a low-level input signal (source). The components of an amplifier may be contained in a single enclosure (e.g., housing, box, assembly, case). The components may be contained in multiple enclosures with any combination of components in each enclosure.

A pre-amp may present a suitable impedance (e.g., matched impedance) to a signal source. A pre-amp may provide gain (e.g., amplification) to the input signal to produce a signal suitable for further processing. A user interface may be provided to a user to adjust the gain of the pre-amp. A pre-amp may provide suitable output impedance to a component for further processing. A pre-amp may provide equalization and/or mixing of the input signal. A pre-amp may produce distortion in a signal. A pre-amp may contain any combination of conventional circuit elements (e.g., electron tubes, semiconductors, integrated circuits, transistors, resistors, capacitors, inductors, transformers) to perform these functions. A pre-amp may be omitted (e.g., left out, not included) from an amplifier if its function is performed by another component or if its function is not required.

A phase splitter may electrically couple to a pre-amp to provide further processing. A phase splitter may produce one or more signals from an input signal which differ in phase (e.g., different polarities, quadrature signals) from one another. A phase splitter may provide a suitable impedance for an input and/or an output circuit coupled to the phase splitter. For example, a phase splitter may separate an input signal into two signals with opposite polarities for further processing by a push-pull amplifier circuit. In another example, a phase splitter may produce a single signal for further processing by single phase amplifier. A phase splitter may be omitted from an amplifier if only a single phase of the signal is required for further processing. A phase splitter may contain any combination of conventional circuit elements to perform these functions.

A power amplifier amplifies an input signal to a sufficient power level (magnitude) to drive a load (e.g., utilization device, antenna, loudspeaker, circuit that consumes electric power). A load may be one or more devices. A device that provides additional processing may be a load. A power amplifier may be the last stage in an amplifier before a load. A user interface may be provided to a user to adjust an amount of power output by the power amplifier. A power amplifier may employ any class of operation or service (e.g., Class A, Class AB, Class C, Class D). The signal output by the power amplifier may include distortion (e.g., harmonic distortion, crossover distortion). The output of the power amplifier may be proportional to the input signal (e.g., linear). There may be a non-linear relationship between the output of the power amplifier and the signal input to the power amplifier. A power amplifier may contain any combination of conventional circuit elements to perform these functions.

A power supply includes a supply of energy. Energy may be used for enabling the operation of electronic circuits (e.g., devices) such as an amplifier, processing circuit, and/or a user interface. A power supply may include any conventional component for providing energy such as a battery, a transformer that transforms line power, and/or a capacitor. A power supply may store energy for providing energy. Energy from a power supply may be used as a force (e.g., voltage, current) for an amplifier as discussed herein.

Tone refers to the pitch, quality, and strength of musical or vocal sounds. A tone stack may output a processed input signal that has been modified in accordance with a user interface. A tone stack may provide a user interface to adjust a frequency response (e.g., the quantitative measure of the output spectrum) of an input signal. A tone stack may adjust timbre (e.g., tone color, tone quality) of an audio signal. The user interface may provide for user adjustment of treble (e.g., tones at the higher range of human hearing), bass (e.g., tones at the lower frequency or range of human hearing), and/or middle (e.g., tones at the midrange of human hearing). A tone stack may allow a user to control equalization, reverberation, and/or mixing of the input signal. A tone stack may provide an effects output port (e.g., connection, socket, plug) and an effects input port for an external device to connect. The external device may provide modification (e.g., additional effects) to the signal from the effects output port and return the modified signal to the effects input port of the tone stack. A tone stack may contain any combination of conventional circuit elements to perform these functions.

A transformer may provide impedance matching of an amplifier output to an impedance of a load. A transformer may provide galvanic isolation (e.g., blocking of direct current). A transformer may provide alternating current restoration (e.g., converting direct current in a transformer primary winding to alternating current in the transformer secondary winding). Impedance matching may maximize the power transfer from an amplifier to a load. Impedance matching may minimize a signal reflection from a load. A transformer may provide a center tap for connecting to a bias voltage. A transformer may provide connections to winding ends to accept output signals from a power amplifier. A transformer may contain any combination of conventional circuit elements to perform these function.

A user interface may include electronic devices (e.g., switches, push buttons, touch screen, potentiometers, rheostats, wireless transceiver, remote controls) for receiving information (e.g., data) from a user. A user may manually manipulate one or more electronic devices of a user interface to provide information. Electronic devices for receiving information from a user may include a wireless receiver that receives information from an electronic device (e.g., smartphone, tablet, watch). A user may manually provide information to a user interface via an electronic device. A user interface may include electronic devices for providing information to a user. A user may receive visual and/or auditory information from a user interface. A user may receive visual information via devices (e.g., LCDs, LEDs, light sources, graphical and/or textual display) that display information. A user interface may include a wireless transmitter for transmitting information to an electronic device for presentation to a user.

For example, amplifier 100, shown in FIG. 1, includes pre-amp 120, phase splitter 140, power amplifier 150, and power supply 160. Pre-amp 120 electrically couples to an input signal and provides the functions of a pre-amp as described above. Pre-amp 120 processes the input signal for further processing by phase splitter 140. The input of phase splitter 140 electrically couples to the output of pre-amp 120. Phase splitter 140 provides the functions of a phase splitter as described above. The output of phase splitter 140 electrically couples to the input of power amplifier 150. Power amplifier 150 provides the functions of a power amplifier as described above. Power amplifier 150 electrically couples to a load. Power supply 160 provides the energy required by pre-amp 120, phase splitter 140, and power amplifier 150. A user interface (not shown) may provide the user a means for controlling the amount of power output from amplifier 100. A user interface may provide the user with a means of controlling other characteristics and/or functions of amplifier 100.

In another example, amplifier 200, shown in FIG. 2 includes input port 210, pre-amp 220, tone stack 230, phase splitter 240, power amplifier 250, transformer 260, loudspeaker 270, and power supply 280. Input port 210 may provide an electrical connection for an input signal and couples that signal to an input of pre-amp 220. A gain (e.g., amplification, boost, volume, increase in power) of pre-amp 220 may be set via a user interface. Pre-amp 220 performs the functions of a pre-amp on the input signal as described above. Tone stack 230 couples to pre-amp 220 and takes as an input the signal output by pre-amp 220. A user may adjust (e.g., modify, alter) the tonal qualities (e.g., timbre, bass, treble, midrange, reverberation) of the signal processed by tone stack 230 via a user interface. Tone stack 230 performs the function of a tone stack as described above and outputs a signal for phase splitter 240. Phase splitter 240 couples to tone stack 230 and performs the function of a phase splitter as described above. Phase splitter 240 may separate a signal into one or more phases to be processed by power amplifier 250.

Power amplifier 250 couples to phase splitter 240 and receives the signal output by phase splitter 240. The output power of the signal from power amplifier 250 may be controlled through a user interface. Power amplifier 250 may provide distortion (e.g., harmonics, crossover) to the signal. Power amplifier 250 performs the function of a power amplifier as described above.

Power amplifier 250 may be a push pull amplifier which has an output stage that can drive a current in either direction through a load. The output stage of a typical push pull amplifier may include at least one electron tube (e.g., vacuum tube, receiving tube, gas tube). Electron tubes for amplifiers may be conventional amplifier tubes (e.g., triode, tetrodes, pentodes). The output stage may include at least one semiconductor device (e.g., transistor, BJT, FET). Bipolar junction transistors (BJTs or bipolar transistors) are devices that rely on the contact of types of semiconductor (e.g., PNP, NPN) for its operation. Field-effect transistors (FETs) use an electric field to control the shape and therefore the conductivity of a channel of one type of charge carrier in a semiconductor. FETs may be junction field-effect transistors (JFETs), metal oxide semiconductors (MOSFETs) or any other conventional FET transistor.

A push pull amplifier may operate in a particular class of service (e.g., Class A, Class B, Class AB) with any of the devices described above (e.g., electron tube, BJT, FET). The class of service may be changed by altering the bias parameters of a device.

Transformer 260 couples to, and receives a signal from, power amplifier 250. Transformer 260 provides a matching impedance to loudspeaker 270. Transformer 260 provides the function of a transformer as described above. Transformer 260 may provide galvanic isolation. Transformer 260 may provide alternating current restoration.

Power supply 280 provides a source of energy for pre-amp 220, tone stack 230, phase splitter 240, power amplifier 250, and transformer 260. Power supply 280 performs the function of a power supply as described above.

The components of amplifier 200 may be contained within a single housing (e.g., enclosure, cabinet). A plurality of housings may contain any combination of components, each housing electrically coupled to another housing to provide the electrical connections between components described above.

Figure 3:
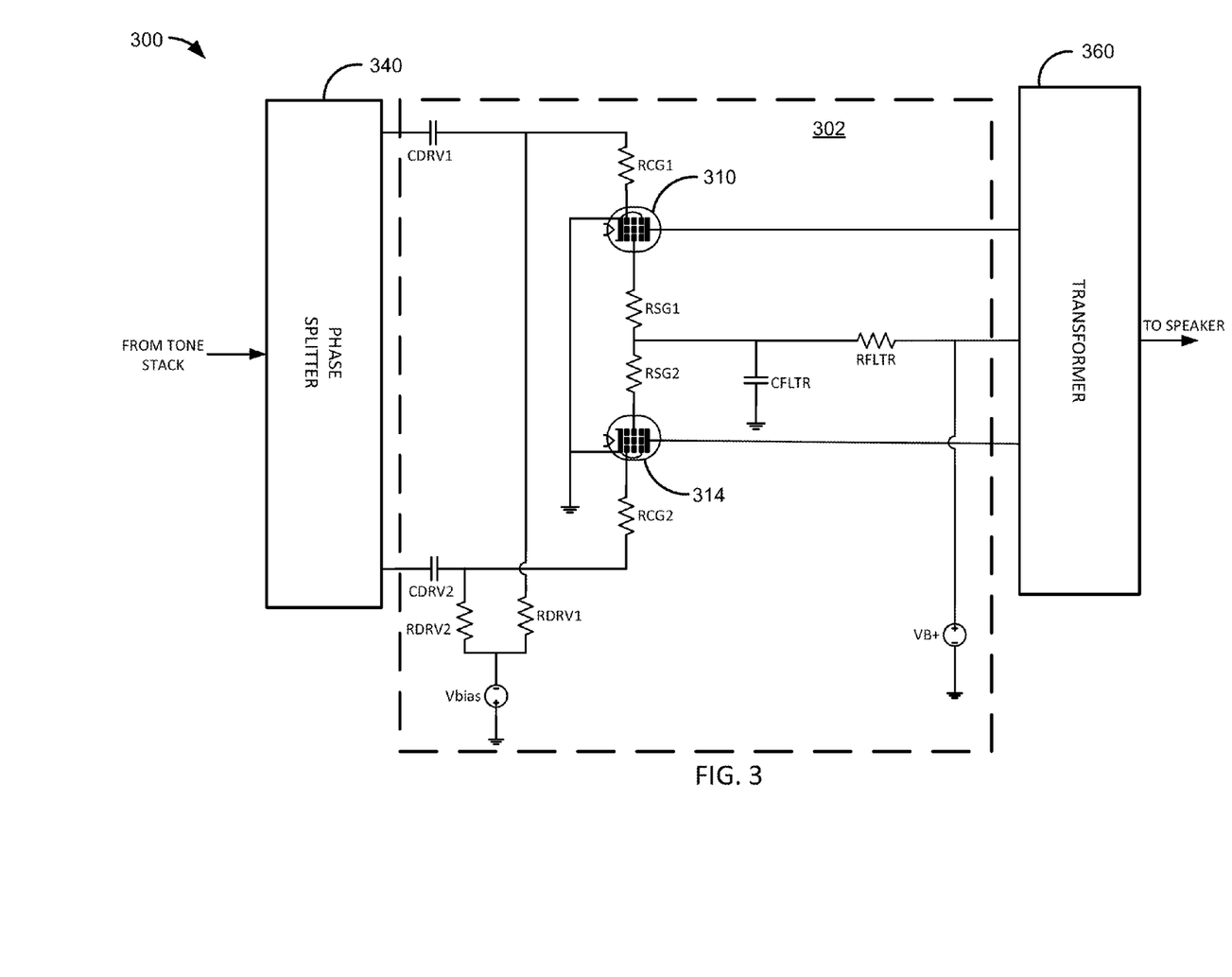
FIG. 3 is a schematic diagram of a circuit of a fixed bias power amplifier of the audio amplifier of FIG. 1.

Power amplifier 302 in FIG. 3 provides an example of a push pull amplifier performing the functions of power amplifier 250. The output stage in this example uses two pentode electron tubes, tubes 310 and 314. The suppressor grids of tubes 310 and 314 are connected to their respective cathodes which are in turn connected to the circuit ground. The suppressor grids may be connected to a biasing circuit with any combination of resistors, capacitors, diodes, or other conventional circuit elements. The heater connections to a power supply are not shown. VB+ provides a fixed voltage through a center tap of transformer 360 to the plates of tubes 310 and 314. VB+ also provides a fixed voltage, filtered through RFLTR and CFLTR, with current limited by RSG1 and RSG2, to the screen grids of tubes 310 and 314, respectively. Phase splitter 340 provides two signals to the input of power amplifier 302. The input signals are filtered by CDRV1 and RDRV1, which also provides AC (alternating current) coupling (e.g., capacitive coupling, blocking of direct current signals), to tube 310 and biased by fixed voltage Vbias through RCG1 and RDRV1. Similarly, CDRV2 and RDRV2 provides filtering and AC coupling, and RCG2 and RDRV2 with Vbias provides biasing for tube 314. The biasing in this example is set (e.g., predetermined, established) by a circuit designer.

For push pull Class AB1 operation, the plate voltage, screen voltage and total zero signal plate current must be maintained in accordance with tube 310 and 314 specifications. As an example, with a 6BQ5 (EL84) power amplifier pentode for tubes 310 and 314, plate and screen grid voltages are 300 volts and total zero signal plate (quiescent) current is 36 mA (milliamperes) per tube according to the manufacturer's specifications (e.g. data sheet, application note). The voltages and current may be different for other tube selections. As the power output or amplifier gains changes, tubes 310 and 314 may not remain within the design specifications for push pull Class AB1 operation.

Figure 4:
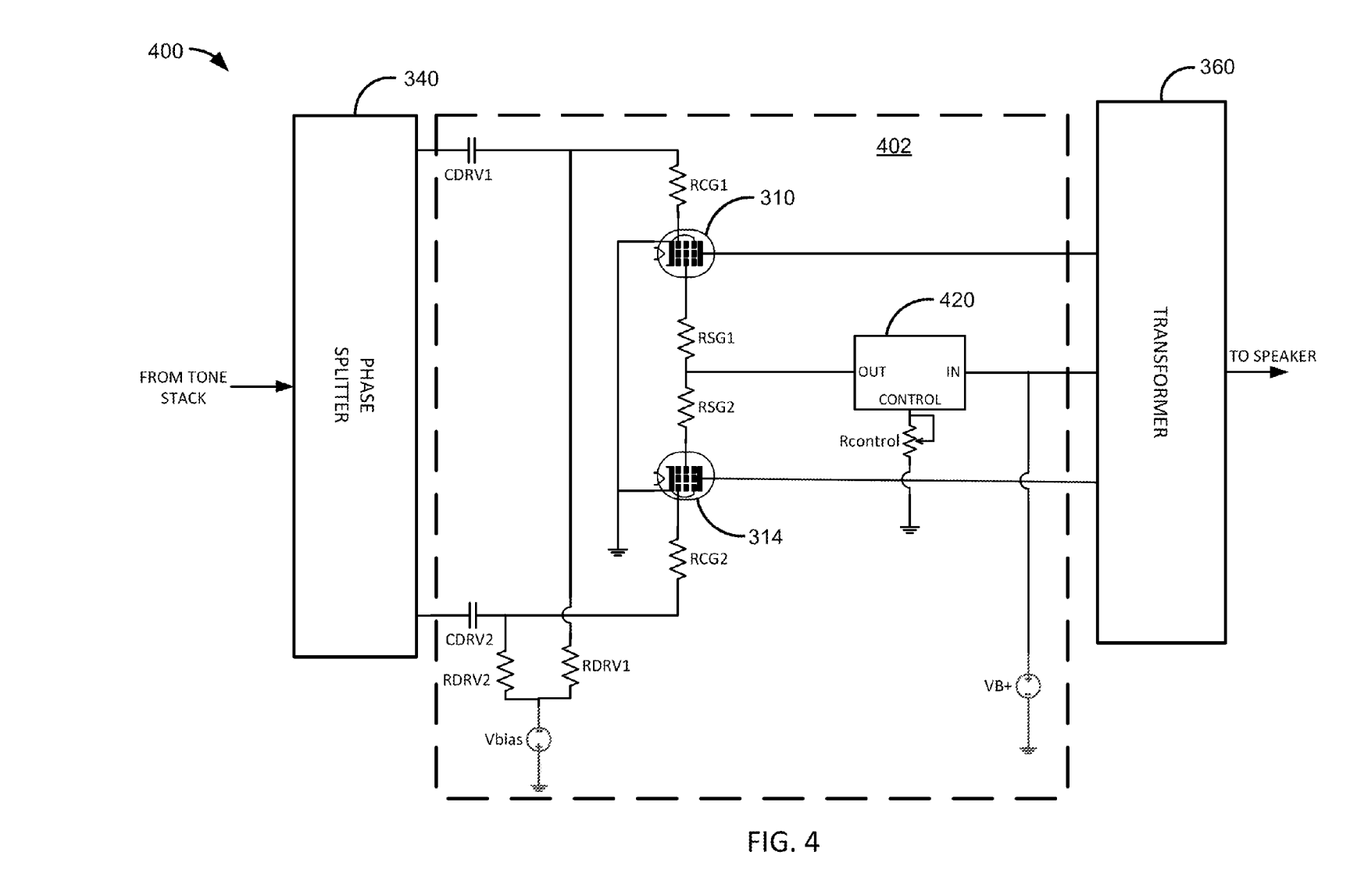
FIG. 4 is a schematic diagram of a circuit showing a voltage regulator biasing of the amplifier of FIG. 2.

In an embodiment of the present invention, power amplifier 402 in FIG. 4 shows the use of a voltage regulator to supply a regulated voltage to the screen grids of tubes 310 and 314. Regulator 420 may supply a predetermined voltage. Rcontrol may adjust the output voltage of regulator 420 which, in turn, controls the output power. Regulator 420 may automatically maintain a voltage level (typically within a ±5% output voltage tolerance) and thus may reduce unwanted voltage variations (e.g., ripple, spiking). Voltage regulator 420 may be implemented with a non-linear regulator. A linear regulator may be used to implement the functions of regulator 420. Any combination of conventional circuit components may be used to perform the functions of voltage regulator 420.

In other embodiments of the present invention, the voltage regulator may supply a regulated voltage to the plates of tubes 310 and 314. The voltage regulator may supply a regulated voltage to the screen grids and plates of tubes 310 and 314.

Figure 5:
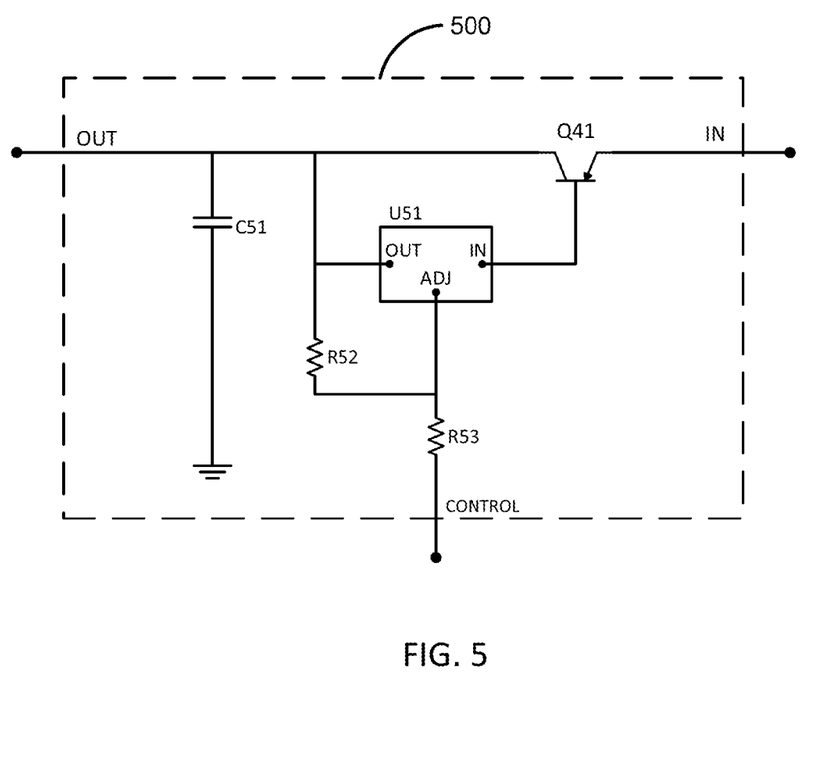
FIG. 5 is a schematic diagram of a circuit of an implementation of the voltage regular bias of FIG. 4 according to various aspects of the present invention.

Regulator 500 in FIG. 5 provides an example circuit of voltage regulator 420. A convention linear voltage regulator (e.g., Microchip LR8 high input voltage, adjustable 3-terminal linear regulator) may be used for regulator U51. Unregulated input power is supplied to the IN connection. The regulated output voltage is provided at the OUT connection. The ratio of R52 and R53 determines the output voltage level. The output voltage may be controlled via a variable resistance between the CONTROL connection and circuit ground. Thus, the CONTROL input determines the output power of the power amplifier. Bypass transistor Q41 boosts the current available through regulator 500.

Figure 6:
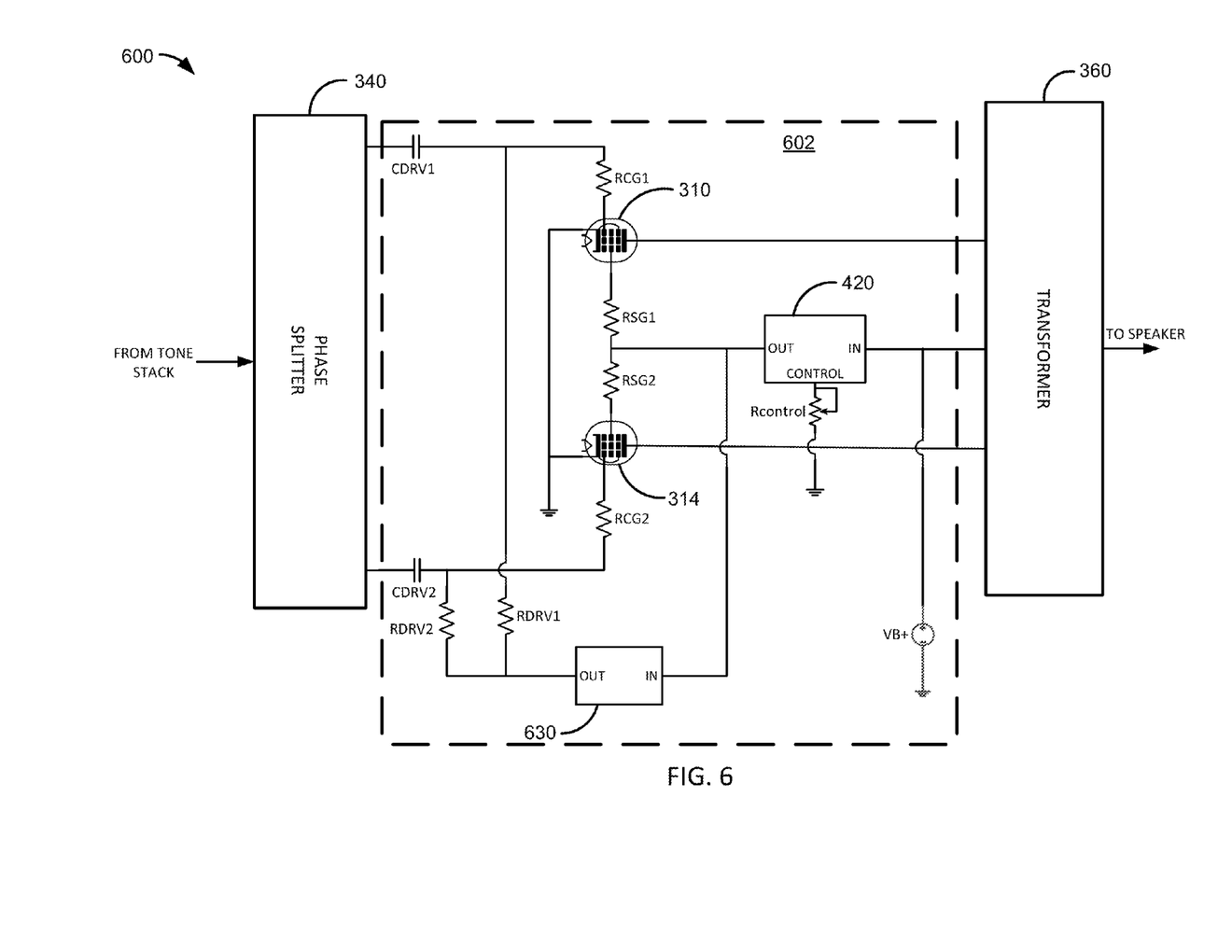
FIG. 6 is a schematic diagram of the circuit of FIG. 4 showing a tracking control grid bias.

In another embodiment of the present invention, power amplifier 602 in FIG. 6 includes control grid (CG) bias 630. CG bias 630 may follow a control law in which the output voltage is determined by the voltage at the input at any given instant. The control law relationship may be linear or may be non-linear. CG bias 630 maintains a relationship between a screen grid voltage and a control grid voltage on tubes 310 and 314 while a constant plate voltage may be maintained. The tonal characteristics of an output audio signal are thus substantially invariant (e.g., relatively constant, little or no change) when the screen grid voltage changes because the bias voltage changes in a control law relationship to the screen grid voltage. By controlling the CG bias voltage, the zero-signal (quiescent) plate current can be maintained according to the tube specifications.

As used herein, "substantially invariant" and "relatively invariant" when used with tonal characteristics or input-output spectral relationships means that any change in the frequency composition of the output signal is imperceptible (e.g., unnoticeable, undetectable, indistinguishable, indiscernible) to an ordinary person listening to the sounds produced through a loudspeaker or that any change in frequency composition does not alter a result of any further processing of the output signal.

Figure 7:
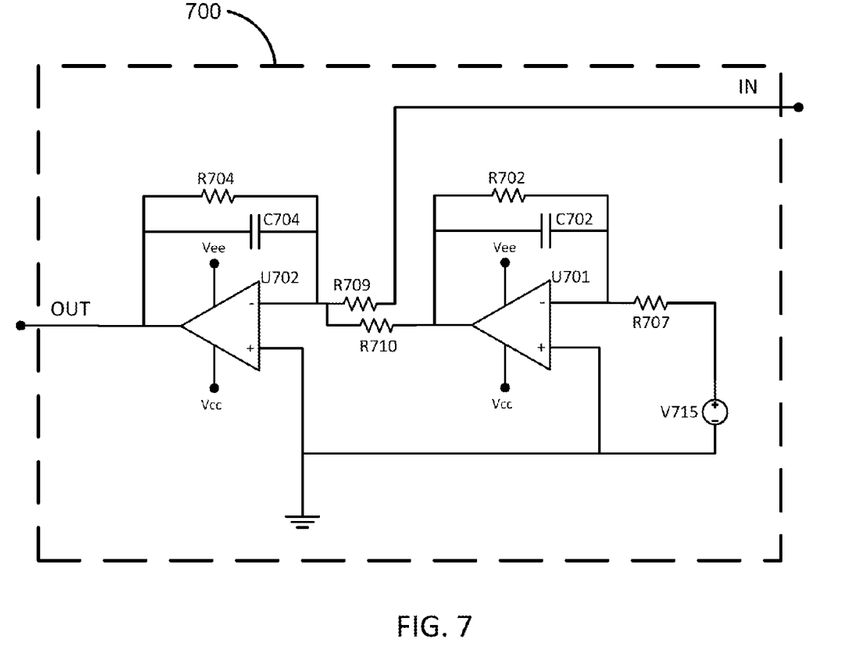
FIG. 7 is a schematic diagram of a circuit showing an implementation of a tracking control grid bias of FIG. 6 according to various aspects of the present invention.

CG bias 700 in FIG. 7 is an example of a circuit to perform the function of CG bias 630. Operational amplifier (OPAMP)

U701 provides an inverted (e.g., opposite polarity) signal proportional to fixed reference voltage V715. The ratio of impedances R702 to R707 determines the gain of OPAMP U701. OPAMP U702 produces a signal proportional to the difference of an IN signal and the output from OPAMP U701. In general, the output of OPAMP U702 may be the product of the impedance value of R704 with the sum of IN divided by the value of impedance R709 and the output voltage of OPAMP U701 divided by the impedance of R710. The resulting output of OPAMP U702 follows a control law relationship to the IN input signal (the screen grid voltage). The functions of an operation amplifier may be implemented with any combination of conventional electronic components.

If U310 and U314 are both 6BQ5 (EL84) electron tubes, for example, and the screen grid voltage changes from 300 volts to 100 volts while the plate voltage is maintained at 300 volts, the control grid voltage must decrease by 773 millivolts to maintain a zero signal (quiescent) plate current of 36 mA, as specified by the manufacturers for the particular class of service. Thus, if a linear relationship is assumed, CG bias 700 produces the following relationship:

$$V_{CGB} = -0.053135 V_{SGB} + 4.54 \text{ Volts} \quad \text{Equation 1:}$$

where $V_{CGB}$ is the control grid bias voltage (output) and $V_{SGB}$ is the screen grid bias voltage (input).

The values of fixed reference voltage V715 and impedances R702, R704, R707, R709 and R710 may be appropriately selected to achieve the relationship in Equation 1 in this example. Capacitors C702 and C704 may be included to provide low-pass filtering or may be omitted from CG bias 700.

Figure 8:
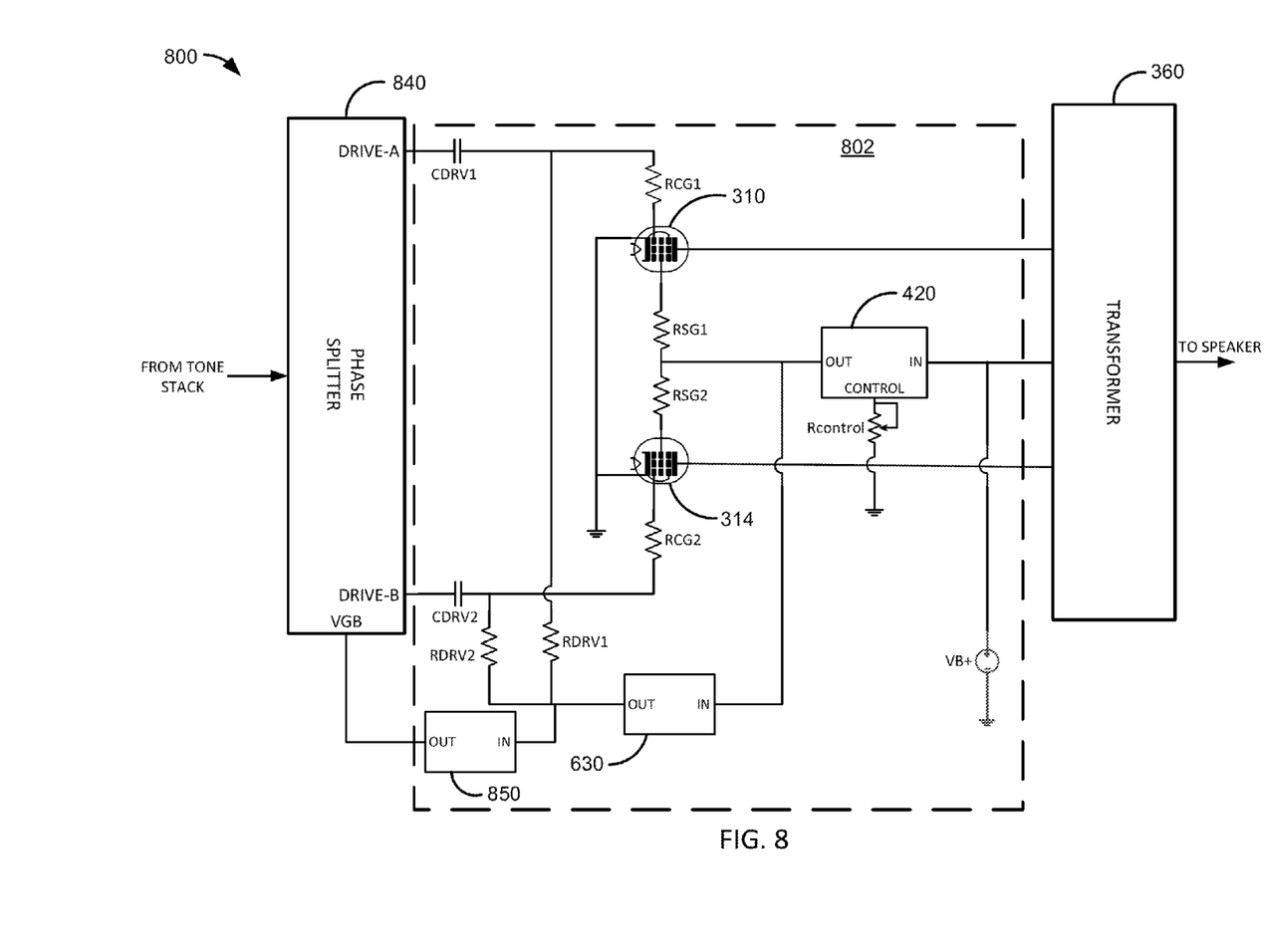
FIG. 8 is a schematic diagram of a circuit of FIG. 6 showing a phase splitter bias.

In another embodiment of the present invention, circuit 800 in FIG. 8 includes a voltage controlled differential amplifier (VCDA) in phase splitter 840. The VCDA is controlled by control law amplifier 850. The combination of amplifier 850 and VCDA may prevent the loss of dynamic range of output power due to the control grid voltage of tube 310 and/or tube 314 becoming positive with respect to the cathode. A change in the power amplifier class of service from Class AB1 to Class AB2 would result in an electron tube grid voltage becoming positive with respect to the cathode. Amplifier 850 produces a signal in relation to the control grid bias voltage of tubes 310 and 314 that, in turn, changes the drive level within phase splitter 840.

Figure 9:
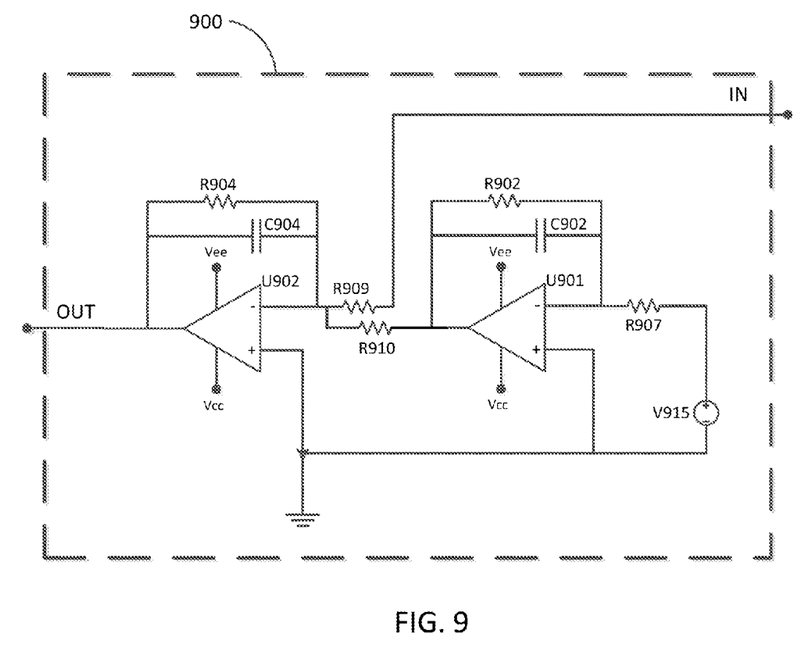
FIG. 9 is a schematic diagram of a circuit of FIG. 8 showing a control grid phase splitter bias according to various aspects of the present invention.

An example of a circuit implementing a control law amplifier is shown in amplifier 900 in FIG. 9. OPAMP U901 produces a voltage proportional to fixed reference voltage V915. The voltage is proportional to the ratio of the values of impedances R902 to R907. OPAMP U902 produces a voltage proportional to the difference in voltage between an IN input signal and an output of OPAMP U901. The values of impedances R902, R904, R907, R909, and R910 determine the relationship of the voltage at output OUT to reference voltage V915 and the IN input voltage. The functions of OPAMPs U901 and U902 may be implemented with any combination of conventional electronic circuit components. OPAMPS U901 and U902 may be implemented with integrated circuit operational amplifiers (e.g., Texas Instruments (TI) TL082, TI TL072, TI LF353).

Figure 10:
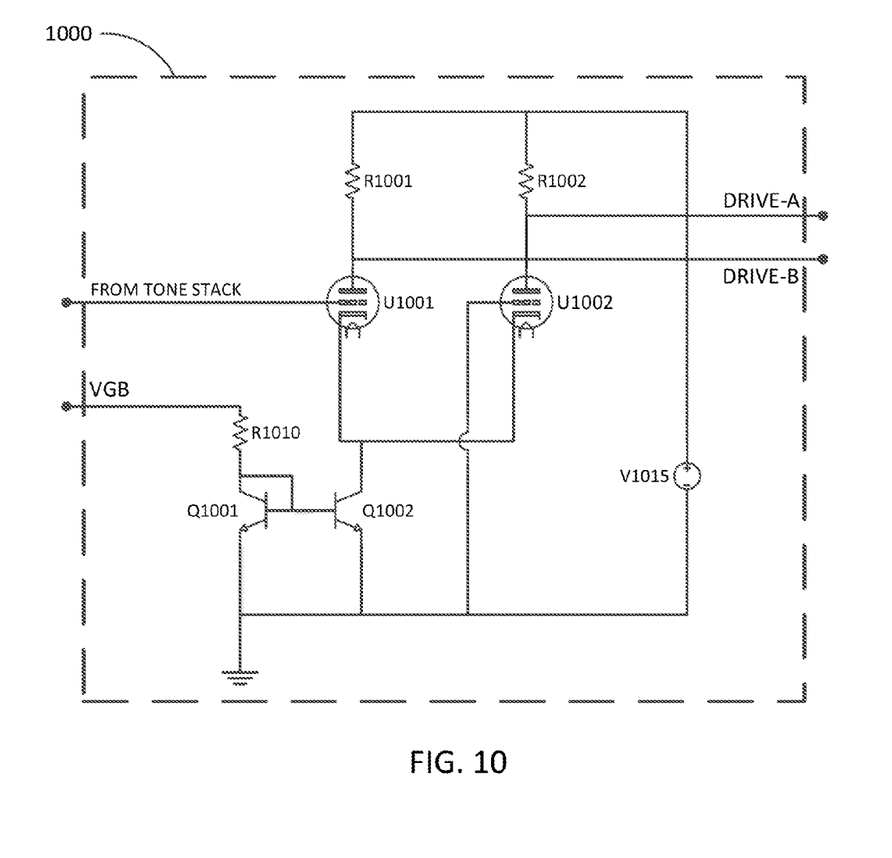
FIG. 10 is a schematic diagram of FIG. 8 showing a phase splitter with a voltage controlled differential amplifier according to various aspects of the present invention.

An example of a circuit implementing a phase splitter with a VCDA is shown in phase splitter 1000 in FIG. 10. Transistors Q1001 and Q1002 form a differential amplifier controlled by input VGB. Input voltage VGB determines the current through Q1002 and thus the cathode current in tubes U1001 and U1002. In this example, tubes U1001 and U1002 are triode electron tubes arranged in a common cathode configuration (e.g., long-tailed pair, differential pair). Phase splitter 1000 produces two output signals, DRIVE-A and DRIVE-B, with opposite polarities (e.g., 180 degree phase difference) which may serve as inputs to power amplifiers 302, 402, 602, and 802.

The differential amplifier in phase splitter 1000 may be implemented with transistors as shown. The differential amplifier may be implemented with operational amplifiers. Any combination of conventional electronic components that performs the function of a VCDA may be used.

The functions of tubes U1001 and U1002 may be implemented with electron tubes. Transistors may be used to implement the functions of U1001 and U1002. Operational amplifiers may be used to implement the functions of U1001 and U1002. Any combination of conventional electronic components that perform the functions of U1001 and U1002 may be used.

Implementations of the present invention in an amplifier may include fixed or variable voltage regulator 420 of FIG. 4. Other implementations of the present invention may include control law amplifier 850 and a VCDA of phase splitter 840. In still other implementations, an amplifier may include fixed or variable voltage regulator 420, control law amplifier 630, control law amplifier 850, and a VCDA of phase splitter 840 of FIGS. 4-10.

The foregoing description discusses preferred embodiments of the present invention, which may be changed or modified without departing from the scope of the present invention as defined in the claims. Examples listed in parentheses may be used in the alternative or in any practical combination. As used in the specification and claims, the words 'comprising', 'including', and 'having' introduce an open ended statement of component structures and/or functions. In the specification and claims, the words 'a' and 'an' are used as indefinite articles meaning 'one or more'. When a descriptive phrase includes a series of nouns and/or adjectives, each successive word is intended to modify the entire combination of words preceding it. For example, a black dog house is intended to mean a house for a black dog. While for the sake of clarity of description, several specific embodiments of the invention have been described, the scope of the invention is intended to be measured by the claims as set forth below. In the claims, the term "provided" is used to definitively identify an object that not a claimed element of the invention but an object that performs the function of a workpiece that cooperates with the claimed invention. For example, in the claim "an apparatus for aiming a provided barrel, the apparatus comprising: a housing, the barrel positioned in the housing", the barrel is not a claimed element of the apparatus, but an object that cooperates with the "housing" of the "apparatus" by being positioned in the "housing".

What is claimed is:

1. An apparatus for amplifying a provided first electrical signal, the apparatus comprising:
   a phase splitter that separates the first signal into one or more second signals, each second signal with a respective phase;
   a power amplifier that boosts an absolute magnitude of voltage of the one or more second signals; wherein
   the power amplifier comprises one or more first electron tubes, one tube for each second signal and a voltage regulator that provides a regulated voltage; and
   the regulated voltage is applied to the screen grids of the one or more electron tubes to establish a respective gain for each tube.

2. The apparatus of claim 1 wherein a second voltage in a predetermined proportion to the regulated voltage is provided to the respective control grids of the one or more electron tubes to maintain a quiescent plate current for the respective screen grid voltage whereby a desired amplifier class of service is maintained.

3. The apparatus of claim 2 wherein the phase splitter further comprises at least one device wherein a bias current of the at least one device is provided by a voltage controlled differential amplifier and wherein the voltage control is proportional to the second voltage to maintain the spectral characteristics over a dynamic range of output voltages.

4. The device of claim 3 comprises one or more electron tubes.

5. The device of claim 3 comprises one or more field effect transistors.

6. The device of claim 3 comprises one or more bipolar junction transistors.

7. The apparatus of claim 1 wherein the phase splitter further comprises at least one device wherein a bias current of the at least one device is provided by a voltage controlled differential amplifier wherein the voltage control is proportional to the second voltage.

8. The apparatus of claim 1 further comprising a pre-amplifier that amplifies a voltage magnitude of the first electrical signal.

9. The apparatus of claim 1 further comprising:
   a tone stack for adjusting tonal qualities of the amplified first signal; and
   a transformer to match an impedance of an output load.

10. The power amplifier of claim 1 wherein the regulated voltage of the voltage regulator is adjustable.

11. The power amplifier of claim 1 wherein the voltage regulator comprises a linear voltage regulator.

12. The power amplifier of claim 1 wherein the regulated voltage of the voltage regulator is set to a predetermined value.

13. The apparatus of claim 1 wherein the first electrical signal comprises frequencies in the audible range.

14. A method of amplifying a provided electrical signal, the method comprising:
   splitting the provided electrical signal into one or more phases;
   amplifying an absolute magnitude of voltage of the more or more phases by one or more electron tubes;
   regulating a first voltage applied to the screen grids of the one or more electron tubes; and
   applying a second voltage to the control grids of the one or more electron tubes, the second voltage proportional to the first voltage.

15. The method of claim 14 further comprising:
   maintaining a predetermined relationship between the first voltage the absolute magnitude of voltage of the more or more phases.

* * * * *